US009711940B2

(12) United States Patent
Duan et al.

(10) Patent No.: US 9,711,940 B2
(45) Date of Patent: Jul. 18, 2017

(54) LASER SOURCE WITH REDUCED LINEWIDTH

(71) Applicants: Guang-Hua Duan, Sceaux (FR); Frédéric Van Dijk, Palaiseau (FR); Gaël Kervella, Antony (FR)

(72) Inventors: Guang-Hua Duan, Sceaux (FR); Frédéric Van Dijk, Palaiseau (FR); Gaël Kervella, Antony (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 14/569,351

(22) Filed: Dec. 12, 2014

(65) Prior Publication Data

US 2015/0171593 A1   Jun. 18, 2015

(30) Foreign Application Priority Data

Dec. 13, 2013   (FR) ..................................... 13 02929

(51) Int. Cl.
*H01S 5/00* (2006.01)
*H01S 5/026* (2006.01)
*H01S 3/067* (2006.01)
*H01S 5/065* (2006.01)
*H01S 3/10* (2006.01)
*H01S 5/12* (2006.01)
*H01S 5/40* (2006.01)

(52) U.S. Cl.
CPC .......... *H01S 5/0268* (2013.01); *H01S 3/0675* (2013.01); *H01S 5/026* (2013.01); *H01S 5/0656* (2013.01); *H01S 3/10084* (2013.01); *H01S 5/1215* (2013.01); *H01S 5/4087* (2013.01)

(58) Field of Classification Search
CPC .... H01S 5/06256; H01S 5/0265; H01S 5/026; H01S 5/0612; H01S 5/1209; H01S 5/125; H01S 5/0261; H01S 5/4087; H01S 5/028; H01S 5/06258; H01S 5/1032; H01S 5/1215; H01S 5/227; H01S 5/024; H01S 5/0268; H01S 3/0675; H01S 5/0656; H01S 3/10084
USPC ....................................................... 372/50.1
See application file for complete search history.

(56) References Cited

U.S. PATENT DOCUMENTS 6,198,568 B1 *   3/2001   Galvanauskas ....... H01S 3/0057
                                                         359/332
6,330,257 B1   12/2001   Major, Jr. et al.
6,370,180 B2 *   4/2002   Zenteno ............ H01S 3/094003
                                                         372/96

(Continued)

FOREIGN PATENT DOCUMENTS

WO   8601303 A1   2/1986
WO   0022705 A1   4/2000

*Primary Examiner* — Tod T Van Roy
*Assistant Examiner* — Vu A Vu
(74) *Attorney, Agent, or Firm* — Baker & Hostetler LLP

(57) ABSTRACT

In the field of narrow linewidth laser sources and a laser device that comprises a laser source and a waveguide of determined refractive index with which it is coupled, a waveguide is single-mode and includes at least four reflectors in the form of trenches etched into the waveguide and irregularly distributed along the waveguide, the distance separating two neighbouring reflectors being above 1 μm, and the waveguide and the laser source have respective lengths such that the length of waveguide over which the reflectors are located is greater than the length of the laser source itself.

11 Claims, 4 Drawing Sheets

(56) References Cited

U.S. PATENT DOCUMENTS

| | | | |
|---|---|---|---|
| 6,690,873 B2* | 2/2004 | Bendett et al. | 385/132 |
| 7,236,674 B2* | 6/2007 | Mizuuchi | G02F 1/3558 |
| | | | 359/326 |
| 2002/0136258 A1* | 9/2002 | Starodubov | H01S 5/146 |
| | | | 372/102 |
| 2012/0099611 A1* | 4/2012 | Kim et al. | 372/20 |
| 2014/0105239 A1* | 4/2014 | Asghari et al. | 372/99 |

* cited by examiner

LASER SOURCE WITH REDUCED LINEWIDTH

CROSS-REFERENCE TO RELATED APPLICATION

This application claims priority to foreign French patent application No. FR 1302929, filed on Dec. 13, 2013, the disclosure of which is incorporated by reference in its entirety.

FIELD OF THE INVENTION

The field of the invention is that of laser sources with reduced linewidths.

BACKGROUND

The linewidth of a laser is of prime importance for a certain number of applications. Mention may be made, for example, of coherent optical transmission systems with high transmission rates, for which a linewidth below 300 kHz is required when used in QAM (Quadrature Amplitude Modulation) mode. To generate a millimetre-wavelength or terahertz wave using the beating of two single-wavelength lasers, the linewidth of these lasers determines the linewidth of the millimetre-wavelength or terahertz wave.

Several solutions exist to reduce the linewidth of a single-wavelength laser source.

The first is of course to design a laser source so that the linewidth is minimized. But it is not always possible to obtain the requisite width in this way.

Another solution is based on external optical back-projection, as illustrated in FIG. 1a. The light 10 emitted by a single-wavelength laser source 1 is reflected by an external reflector 2 and re-injected into the laser source. Under certain phase conditions, the linewidth of the laser can be reduced. But the external reflector generally creates strong resonances in the phase noise spectrum and in the optical emission spectrum of the laser as illustrated in FIG. 1b. However, these resonances, which correspond to those of the external cavity formed by the external mirror 2 and the exit face 11 of the laser source, are undesirable for a large number of applications.

A third solution consists in using random back-projection induced by Rayleigh scattering produced in an optical fibre. Rayleigh scattering is created partly by dopant ions in a single-mode optical fibre. It has been demonstrated that back-projection of Rayleigh type can reduce the linewidth by a factor of $10^6$, for a wavelength at 1550 nm for example. But this back-projection of Rayleigh type is very weak. The mean of the power reflected by the Rayleigh scattering produced in a section of fibre of 1 km is in the order of $3 \times 10^{-5}$, which necessitates the use of very long optical fibres, of a length above 1 km at least, to allow a significant reduction in linewidth to be obtained. As a result the laser device which incorporates the laser source and an optical fibre of such a length is very bulky. Furthermore, temperature variations and vibrations induce fluctuations in the Rayleigh scattering, which translate into undesirable fluctuations in the frequency of the laser.

Furthermore, all these solutions apply to single-wavelength sources only.

Consequently, there remains to date a need for a laser device simultaneously satisfying all the aforementioned requirements in terms of linewidth, bulkiness and frequency stability, and applicable to single- or multi-wavelength laser sources.

SUMMARY OF THE INVENTION

The invention is based on the deliberate creation of reflectors randomly distributed in a waveguide which is coupled with a laser source.

More precisely, the subject of the invention is a laser device that comprises a laser source and a waveguide of determined refractive index with which it is coupled. It is mainly characterized in that the waveguide is single-mode and includes at least four reflectors randomly distributed along the waveguide, the distance separating two neighbouring reflectors being above 1 μm, and obtained by local modification of the refractive index of the waveguide, and in that the waveguide and the laser source have respective lengths such that the length of waveguide over which the reflectors are located is greater than the length of the laser source itself.

Such reflectors make it possible to obtain much stronger reflections than those obtained by the Rayleigh scattering centres of an optical fibre. To reduce the linewidth of the laser, it is then possible to use much shorter waveguides, of a few centimetres or less instead of kilometres of optical fibres. The device, which includes the source and the waveguide, is therefore much more compact. Furthermore, the random nature of the distribution of the reflectors makes it possible to reduce the linewidth without creating pronounced resonances in the phase noise spectrum and in the optical emission spectrum of the laser. Finally, such a device makes it possible not only to reduce the width of a single line in the case of a single-wavelength laser source, but also to reduce the width of each line of a multi-wavelength laser source.

According to a first embodiment of the invention, the laser source and the waveguide form a monolithic assembly, and the reflectors are etched into the waveguide. The laser source is semiconductor-based for example.

According to another embodiment of the invention, the waveguide is coupled with the laser source by way of a coupling device, and the reflectors are etched or obtained by insolation of the waveguide. The coupling device is for example a connector, the laser source and the waveguide being respectively placed in two mutually separate housings; or the coupling device is a lens, the laser source and the waveguide (in the form of a lensed fibre optic for example) being placed in one and the same housing.

The length of the waveguide is typically below 100 m when the waveguide is an optical fibre, and it is typically below 1 cm when the guide is on a semiconductor substrate or glass.

BRIEF DESCRIPTION OF THE DRAWINGS

Other features and advantages of the invention will become apparent upon reading the following detailed description, given by way of non-limiting example and with reference to the appended drawings in which.

From one figure to the other, the same elements are identified by the same reference numbers.

DETAILED DESCRIPTION

Figure 2:
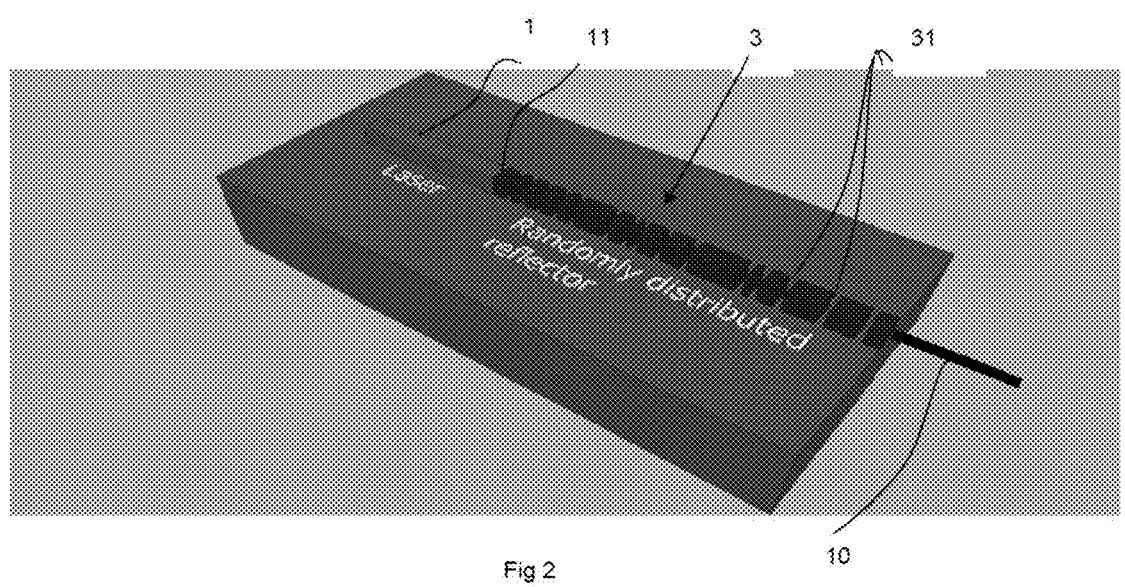

An example of the first embodiment of a laser device according to the invention will now be described as it relates to FIG. 2.

A laser source 1 is coupled with a single-mode waveguide 3 which is integrated monolithically with the laser source: they are both made from the same base material. This coupling between the laser source and the guide can be achieved using several methods, among which mention may be made of end-to-end coupling, and coupling by a mode-size adapter. Reflectors 31 are etched into the waveguide in the form of trenches randomly distributed along the waveguide. The trenches can all have the same length but not necessarily; the length of the trenches (considered along the direction of propagation of the laser 10) is between 50 and 500 nm. The base material is for example based on InP, GaAs or is a photonic integration platform combining a III-V material with silicon for example. In the latter case, it is a hybrid III-V laser source 1. The reflectors 31 are etched into the silicon waveguide 3 in a conventional way, by dry or wet etching.

Figure 3B:
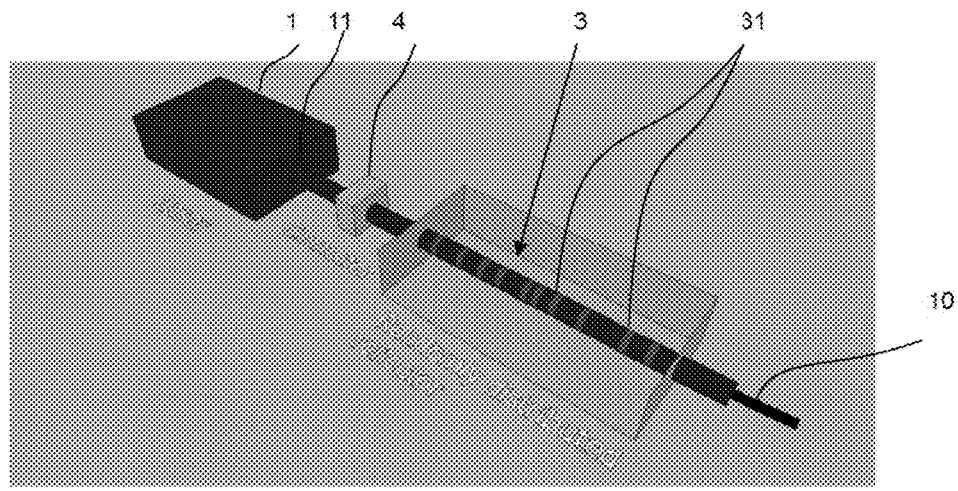
Figure 3A:
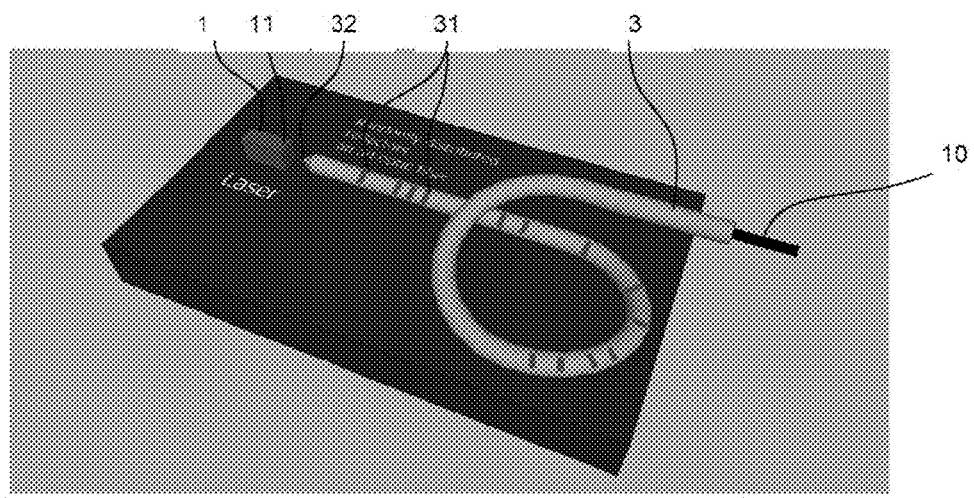

An example of the second embodiment of a laser device according to the invention is shown in FIGS. 3a and 3b with two variants. According to this embodiment, the waveguide 3 is an optical fibre; the laser source 1 and the optical fibre 3 are produced separately, then coupled with each other by means of a coupling device 4. The reflectors 31 are produced in the optical fibre 3, for example by UV illumination through a mask in such a way as to locally modify the refractive index of the optical fibre and thus obtain localized reflectors, as is done in the manufacture of Bragg arrays. The patterns in the mask are randomly distributed in such a way as to obtain a random location of the reflectors along the optical fibre. The laser source can be a solid-state laser such as an erbium-doped fibre laser or a semiconductor laser.

The laser source and the optical fibre can be incorporated into one and the same housing; they are then coupled with each other, for example by means of a lens 32, as is the case when the optical fibre 3 is a lensed fibre as shown in FIG. 3a. In a variant, they are provided in two separate housings; they are then coupled with each other by a connector 4 such as a fibre-optic connector of FC/APC type, as shown in FIG. 3b.

The laser source 1 can be single-wavelength or multi-wavelength, notably by including several single-wavelength lasers; it can also be tunable in wavelength. The wavelength domain is typically situated between 500 nm and 10 μm. The waveguide is preferably single-mode.

By reason of the random nature of the location of the reflectors, the total level of reflected power is the sum of the power levels created by all the reflectors. In other words, the total power reflectivity is the sum of the power reflectivities of all the reflectors.

The reflectors 31 can be identical, i.e. have the same degree of reflection, but not necessarily. The degree of power reflection of each reflector is between $10^{-5}$ and $10^{-2}$. These reflectors can be distinguished from Rayleigh back-projection projection, notably in that they are localized whereas Rayleigh back-projection is a distributed phenomenon, and in that a reasonable total degree of reflection can be obtained according to the invention with all the reflectors over a very short wavelength:

below 100 m in an optical fibre, with a total degree of reflection then $>10^{-3}$ for example, typically below 1 cm in a monolithically integrated waveguide, with a total degree of reflection then $>10^{-1}$ for example, whereas in the case of Rayleigh back-projection the same total degree of reflection cannot be obtained even with a fibre of several tens of km.

According to another embodiment, the laser source is coupled with a single-mode waveguide which is etched in glass. The reflectors are obtained in the form of trenches etched into the wavelength and of course randomly distributed.

The linewidth reduction factor is the ratio of the initial linewidth of the laser source to that of the laser device equipped with its random reflectors. The Applicant has shown that the reduction factor depends:

on the total power reflectivity, on the time of the outward-return journey of the light between the exit face 11 of the laser source and the most distant reflector, and on the time of the outward-return journey of the light inside the cavity of the laser source itself.

Figure 1A:
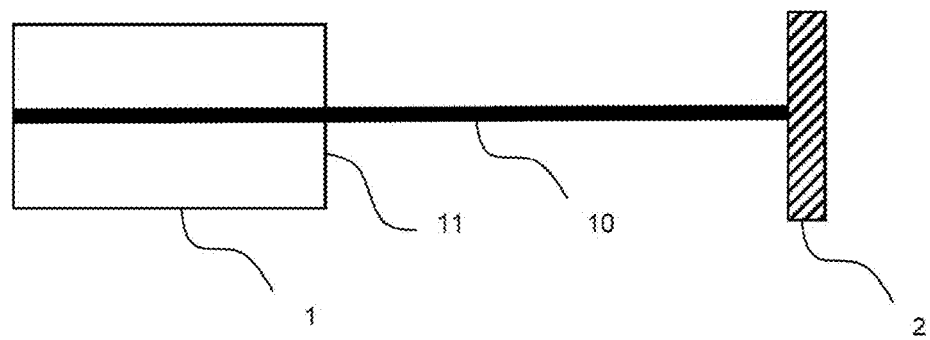
FIG. 1a schematically represents a single-wavelength laser device with linewidth reduction of the prior art and the results obtained are illustrated in FIG. 1b, FIG. 2 schematically represents an example of a laser device according to a first embodiment of the invention, FIGS. 3a and 3b schematically represent an example of a laser device according to another embodiment of the invention, produced in one and the same housing (FIG. 3a) or in two separate housings (FIG. 3b)
Figure 1B:
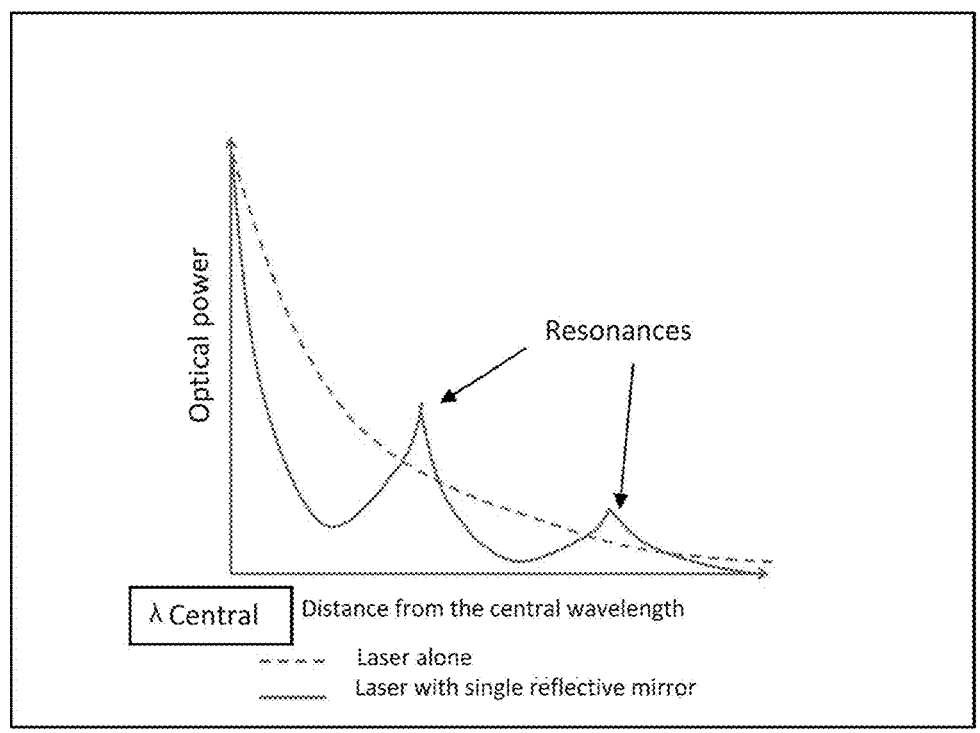
Figure 4:
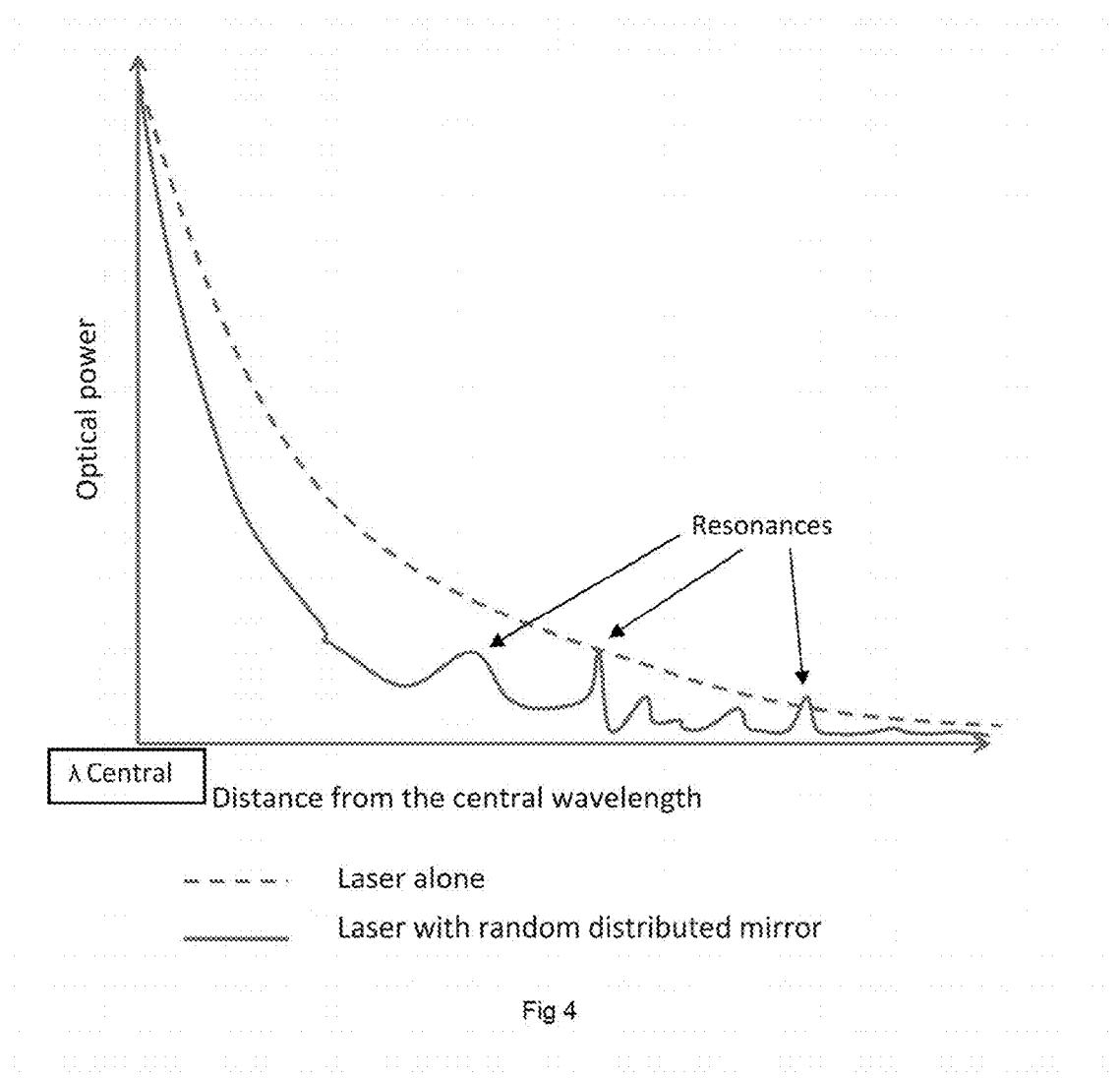
FIG. 4 illustrates the results obtained with one or the other of the embodiments of the invention for a single-wavelength laser source.

Typically, the following will be used in this invention:

a total power reflectivity ≥0.1%, a waveguide (or optical fibre) length over which the reflectors are located, above the length of the laser source itself, these lengths being measured along the axis of propagation of the laser 10, a number of reflectors between 4 and 1000 per millimetre in the case of the monolithically integrated waveguide, between 4 and 10000 per millimetre in the case of the optical fibre. The results obtained are illustrated in FIG. 4: besides the reduction of the linewidth, it is noted that the resonances visible in FIG. 1b are much less pronounced, and distributed randomly.

The random position of the reflectors is obtained by placing the reflectors irregularly along the waveguide. In other words, the distance between neighbouring reflectors is irregular.

Simulations have been carried out using the MATLAB software program to compute the random distribution of the reflectors along the waveguide, using 100, 500 or 1000 reflectors. It generates a random variable x between 0 and 1. The position of the $k^{th}$ reflector is given by:

$$L(k)=Li+(Lf-Li)x,$$

where Li is the length between the exit face of the laser source and the position of the reflector closest to this face, and Lf the length between the exit face of the laser source and the position of the reflector furthest from this face.

The random position of the reflectors can of course be obtained manually.

According to the invention, two neighbouring reflectors are typically mutually separated by a distance above 1 μm, whereas in the case of Rayleigh scattering, the reflectors created by dopant ions are therefore separated by a distance in the order of the nm.

By way of example, it is possible to say that with a total power reflectivity ≥1% obtained with about 1000 reflectors, and a waveguide length 10 times above that of the laser source i.e. 10 mm for example, a reduction factor of 50 is provided for the central wavelength line λ=1550 nm of a semiconductor laser source of a length of 1 mm.

The invention claimed is:

1. A laser device comprising:
a laser source;
a waveguide of determined refractive index; and
a coupling device,
wherein the waveguide is coupled to the laser source by the coupling device,
wherein the waveguide is single-mode and includes at least four reflectors in the form of trenches etched into the waveguide and irregularly distributed along the waveguide, a distance d separating each pair of neighbouring reflectors defined by the at least four reflectors being 1 µm<d<L−3 µm, L being a length of the waveguide, and
wherein the at least four reflectors are positioned over a length of the waveguide that is greater than a length of the laser source, and
wherein a degree of power reflection of each reflector is between 0.001% and 1%.

2. The laser device according to claim 1, wherein the laser source and the waveguide form a monolithic assembly.

3. The laser device according to claim 2, wherein the laser source is semiconductor-based.

4. The laser device according to claim 1, wherein the reflectors are etched or obtained by insolation of the waveguide.

5. The laser device according to claim 4, wherein the coupling device is a connector, the laser source and the waveguide being respectively placed in two mutually separate housings.

6. The laser device according to claim 4, wherein the coupling device is a lens, the laser source and the waveguide being placed in one and the same housing.

7. The laser device according to claim 1, wherein the length of the waveguide is below 100 m.

8. The laser device according to claim 1, wherein the laser source is single-wavelength or multi-wavelength or tunable in wavelength.

9. The laser device according to claim 1, wherein the laser source includes several single-wavelength lasers.

10. The laser device according to claim 1, wherein the laser source is solid-state.

11. The laser device according to claim 1, wherein the at least four reflectors consist of four reflectors, and wherein a total power reflectivity of the waveguide is at least 0.1%.

* * * * *